United States Patent
Aziz et al.

(10) Patent No.: US 7,421,050 B2
(45) Date of Patent: Sep. 2, 2008

(54) PARALLEL SAMPLED MULTI-STAGE DECIMATED DIGITAL LOOP FILTER FOR CLOCK/DATA RECOVERY

(75) Inventors: Pervez Mirza Aziz, Dallas, TX (US); Donald Raymond Laturell, Allentown, PA (US); Vladimir Sindalovsky, Perkasie, PA (US)

(73) Assignee: Agere Systems Inc., Allentown, PA (US)

( * ) Notice: Subject to any disclaimer, the term of this patent is extended or adjusted under 35 U.S.C. 154(b) by 727 days.

(21) Appl. No.: 10/965,138

(22) Filed: Oct. 14, 2004

(65) Prior Publication Data

US 2006/0083339 A1    Apr. 20, 2006

(51) Int. Cl.
*H04L 7/00* (2006.01)
(52) U.S. Cl. ............... 375/355; 375/354; 375/376
(58) Field of Classification Search ......... 375/327, 375/355, 376
See application file for complete search history.

(56) References Cited

U.S. PATENT DOCUMENTS

| | | | |
|---|---|---|---|
| 5,247,544 A * | 9/1993 | LaRosa et al. | 375/371 |
| 6,307,906 B1 * | 10/2001 | Tanji et al. | 375/376 |
| 6,526,112 B1 * | 2/2003 | Lai | 375/376 |
| 6,636,120 B2 | 10/2003 | Bhakta et al. | |
| 7,076,377 B2 * | 7/2006 | Kim et al. | 702/66 |
| 7,127,017 B1 * | 10/2006 | Evans et al. | 375/355 |
| 7,257,169 B2 * | 8/2007 | Shahar et al. | 375/340 |
| 2002/0131539 A1 * | 9/2002 | Li et al. | 375/355 |
| 2005/0239398 A1 * | 10/2005 | Lai | 455/3.02 |

* cited by examiner

*Primary Examiner*—Daivd C. Payne
*Assistant Examiner*—Leon-Viet Q Nguyen

(57) ABSTRACT

The present invention utilizes a parallel sampled multi stage decimated digital loop filter for clock and data recovery function. In particular, the present invention provides multiple sampling clocks, with these clocks having sampling clock phases separated in time. These clocks are used in conjunction with multiple data detectors and phase detectors to efficiently process received analog signals in a decimated loop filter system.

30 Claims, 9 Drawing Sheets

PRIOR ART

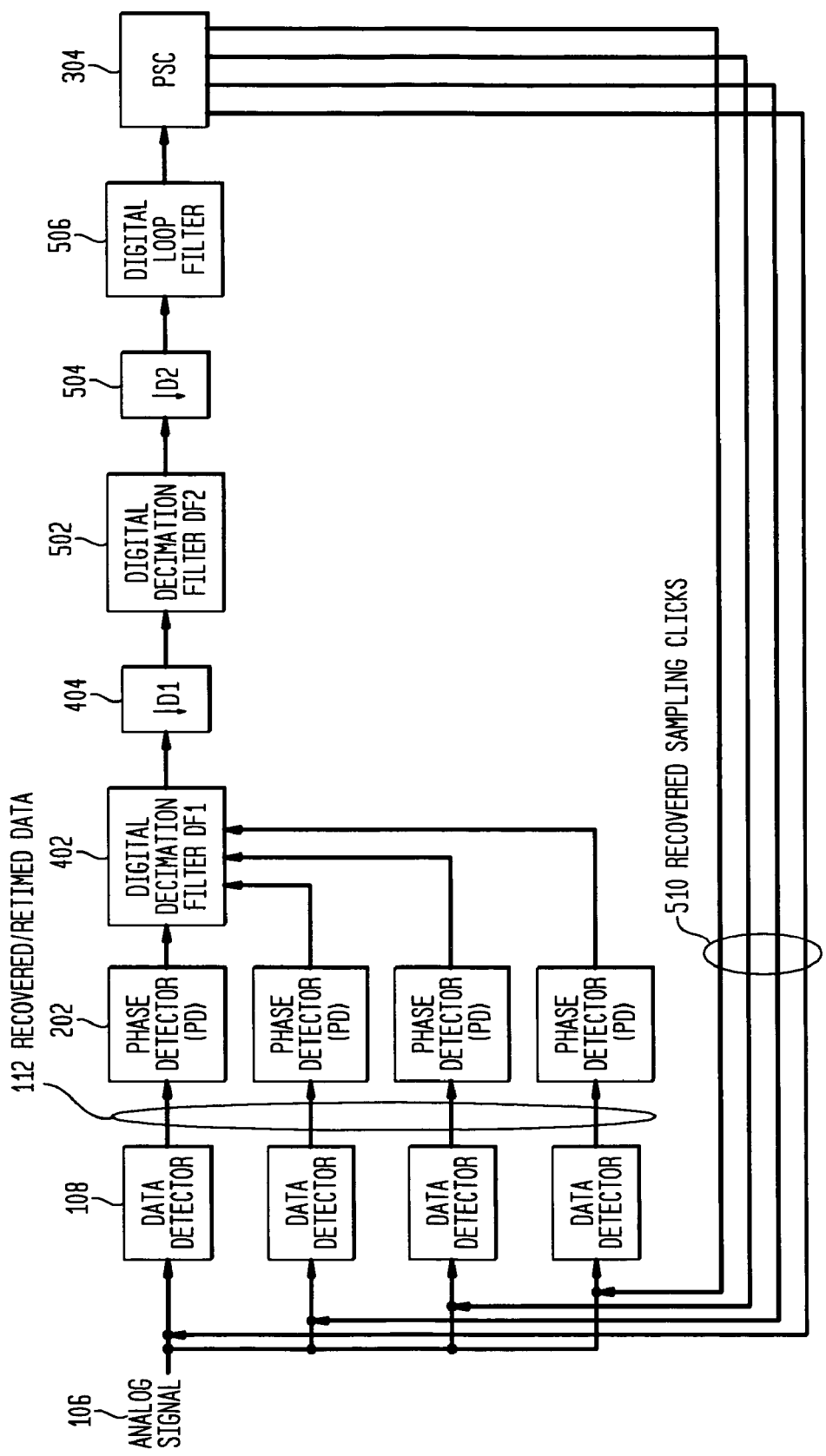

PARALLEL SAMPLED MULTI-STAGE DECIMATED DIGITAL LOOP FILTER FOR CLOCK/DATA RECOVERY

FIELD OF THE INVENTION

The present invention relates to clock recovery and data extraction and, more particularly, to clock recovery and data extraction using digital circuitry.

BACKGROUND OF THE INVENTION

Clock and data recovery (CDR) operations are performed in many communications circuits. Digital communication receivers must sample an analog waveform and then detect the sampled data reliably. The phase of the analog waveform is typically unknown and there may be a frequency offset between the frequency at which the original data was transmitted and the nominal receiver sampling clock frequency. The CDR function is to properly sample an analog waveform such that when the sampled waveform is passed through a data detector, the data is recovered properly despite the fact that the phase and frequency of the transmitted signal are not known. CDR architectures implemented on an integrated circuit chip should not only perform the CDR function robustly but should be area and power efficient.

As illustrated in FIG. 1, a typical serializer/deserializer (Serdes) communication "macrocell" consists of multiple channels (Channel 0, Channel 1, . . . , Channel P), each performing its own CDR function. A common reference clock circuit 102 provides a clock (REFCLK) 104 which is used in each channel to sample the analog waveform 106. The CDR feedback loop must adjust the phase and frequency of the nominal clock to produce a modified clock, a recovered clock 110, which can sample the analog waveform to allow proper data detection 112. A typical data detector 108 might be a simple slicer (decision device based on an amplitude threshold) or a more complicated detector such as a sequence detector. Since the CDR architecture hardware is replicated multiple times, area and power efficiency of the CDR hardware is an important consideration.

Various methods exists in the prior art for performing this CDR function. FIG. 2 illustrates one well known CDR architecture which makes use of an analog loop filter and a voltage controlled oscillator (VCO) to provide the recovered clock. Integral to the depicted analog loop filter 204 is an analog charge pump (not illustrated) which processes the output of phase detector 202 for use by the analog loop filter 204. Another approach is shown in FIG. 3 where digital loop filter 302 controls a phase selection circuit (PSC) 304 which continually adjusts the phase of the reference clock to effectively modify its phase and/or frequency to produce the recovered clock 110. The digital loop filter 302 may consist of one or more sub-filters. One significant drawback to this approach is that the loop filter and PSC must operate at the full high speed data rate. Further, the fixed point arithmetic performed by the digital loop filter must be done with relatively high resolution (more than 9 bits, in some applications 18 bits) and so involves complex fixed point signed arithmetic. Since the complex fixed point arithmetic operates at the full date rate, this results in a relatively large area and power for the digital loop filter and resulting CDR.

More recent prior art CDR architecture has employed a digital loop filter in combination with a VCO. The input to the digital loop filter has been decimated. The process of decimation involves discarding samples so that data can be processed at a lower rate of speed in the digital loop filter where as noted above, complex high resolution fixed point signed arithmetic operations take place. Typically, before discarding samples, they are processed by the decimation filter to minimize the information loss from the phase detector. As used herein, the process of discarding samples is called downsampling and the overall process of decimation filtering and downsampling is called decimation. A high level block diagram of a decimated loop filter is shown in FIG. 4 where downsampling 404 by a factor of D occurs after the decimation filter 402. Consequently, only one out of every D high speed samples is retained and processed by the digital loop filter 302. It should be noted that while the clock sampling phase changes only at 1/Dth of the high speed rate, the recovered sampling clock is a full rate clock.

Although beneficial, the above decimated loop architecture has limitations: (i) It is still fundamentally limited in operating at extremely high speeds as it uses only one sampling clock 110 to provide samples to only one phase detector 202. This means that although the decimation process allows the digital loop filter to work at a lower speed, in a practical implementation a bottle neck will still occur as the phase detector 202 and portions of or the entire decimation filter must operate at the full data rate speed; (ii) a common decimation filter 402 and downsampling factor 404 is necessarily used for the entire loop filter which may limit the area/power tradeoff savings in the loop filter; and, (iii) the architecture uses a VCO 206 instead of a PSC to perform the timing updates.

The present invention overcomes these shortcomings in the prior art and results in a CDR architecture that reduces such processing bottle necks and does so in an manner that is area and power efficient.

SUMMARY OF THE INVENTION

The present invention utilizes a parallel sampled multi stage decimated digital loop filter for clock and data recovery function. Unlike the typical prior art example depicted in FIG. 4, instead of having only one full rate sampling clock working to sample the full speed data into one data detector followed by one phase detector, the present invention provides multiple lower rate sampling clocks, with these clocks having sampling clock phases separated in time. These clocks are used in conjunction with multiple data detectors and phase detectors to thereby overcome the speed bottle neck problems occurring in the prior art.

These and other features of the invention will be more fully understood by references to the following drawings.

BRIEF DESCRIPTION OF THE DRAWINGS

FIG. 5A illustrates an embodiment of the invention having multi stage decimated digital loop filters and two decimation stages;

DETAILED DESCRIPTION

Figure 1:
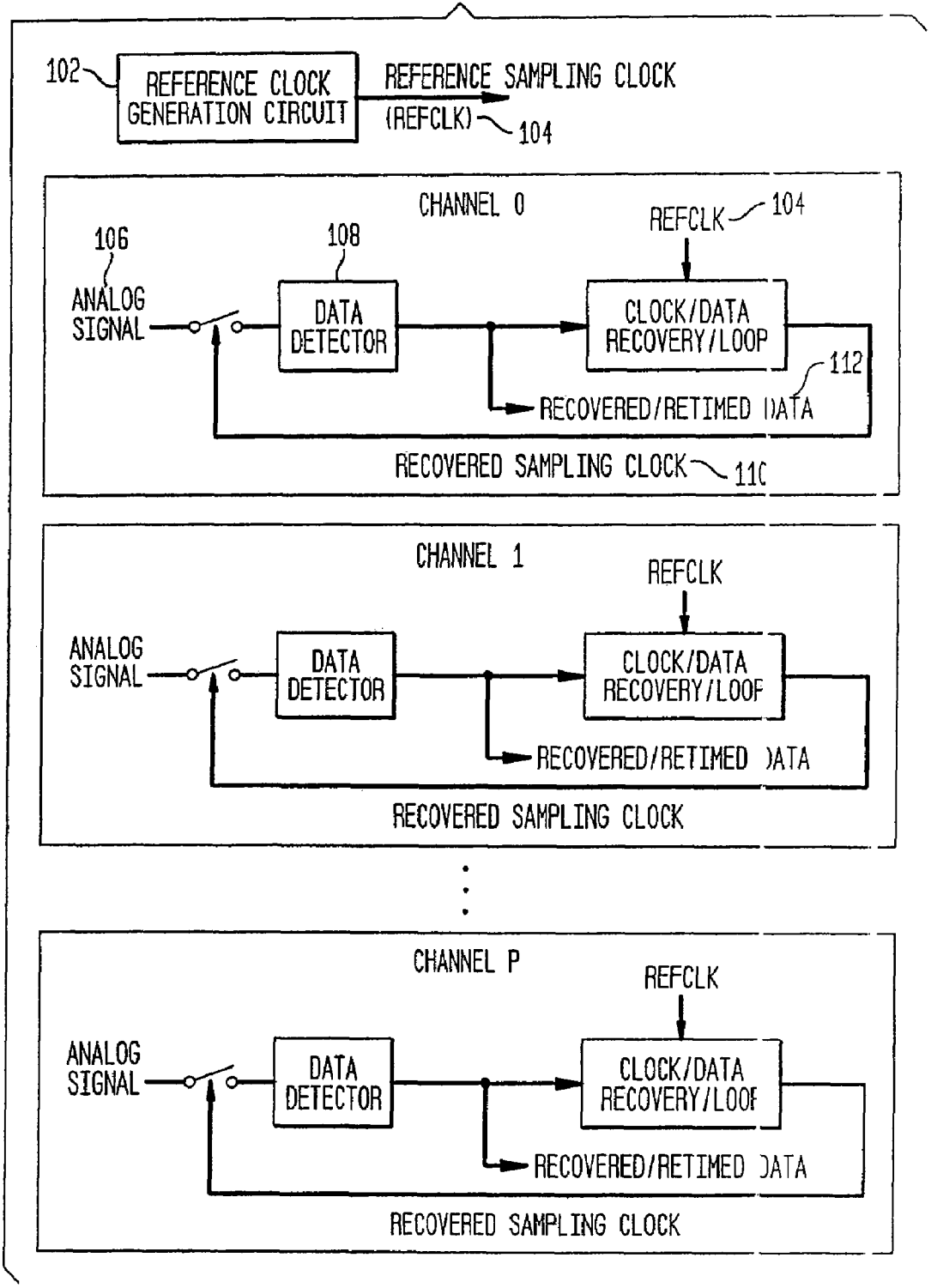
FIG. 1 is a block diagram of a Serdes macro cell containing multiple Serdes channels driven by a common reference clock.
Figure 2:
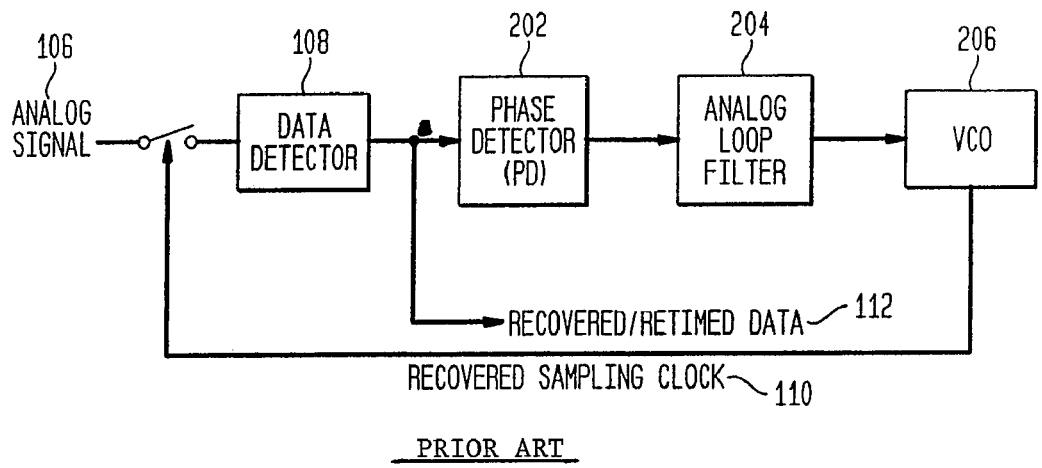
FIG. 2 is a prior art example of analog loop filter based CDR architecture.
Figure 3:
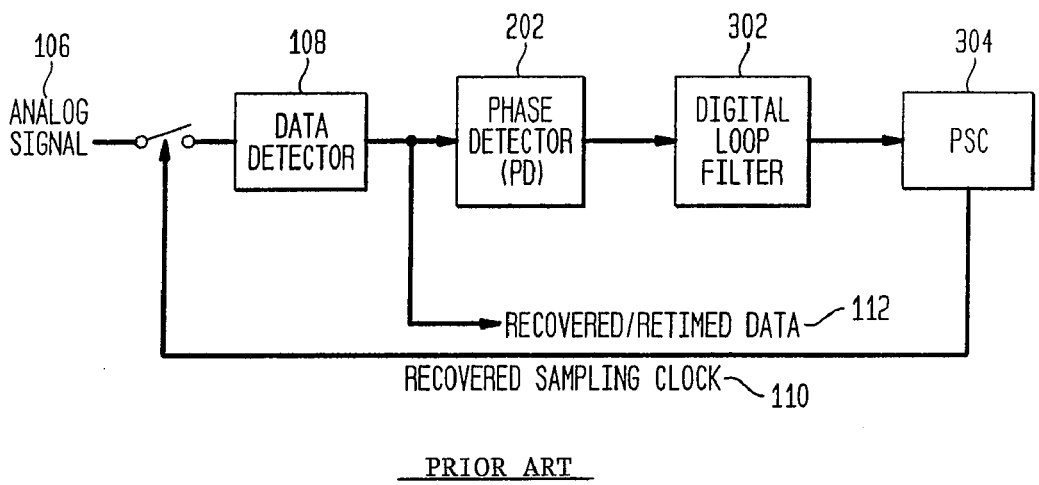
FIG. 3 is a prior art example of digital loop filter based CDR architecture.
Figure 4:
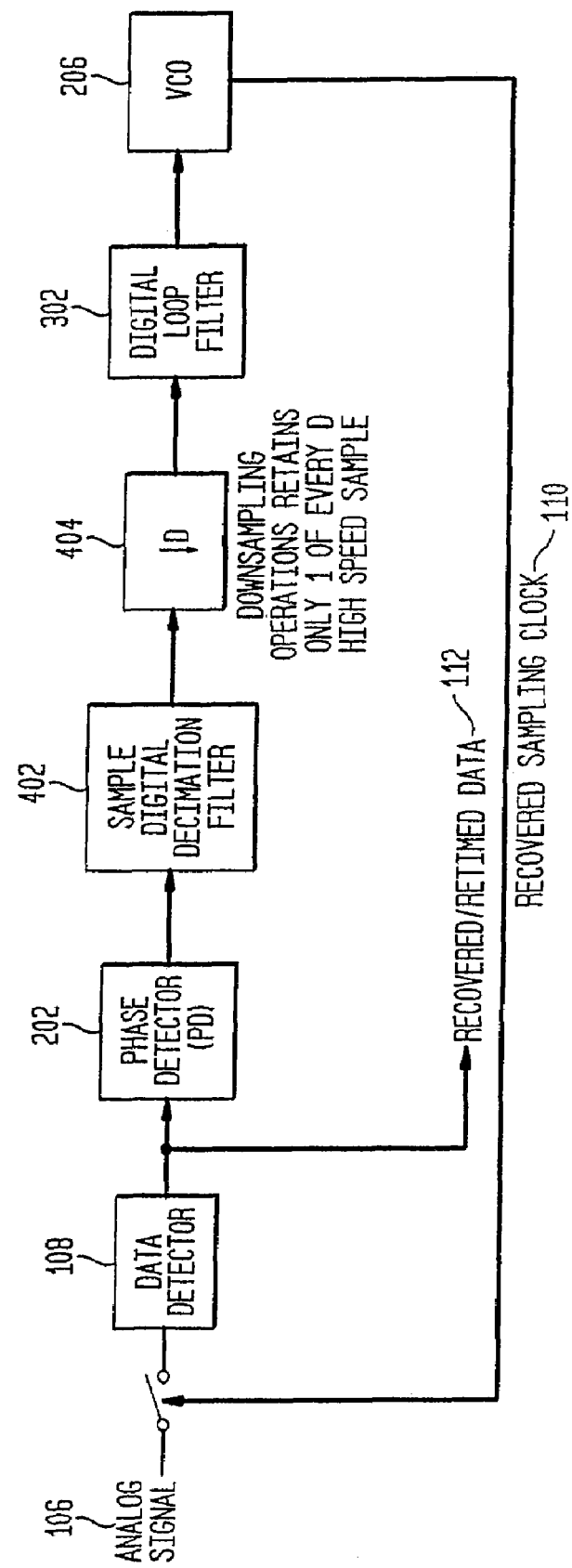
FIG. 4 illustrates a prior art decimated digital loop filter based CDR architecture employing a VCO.
Figure 5B:
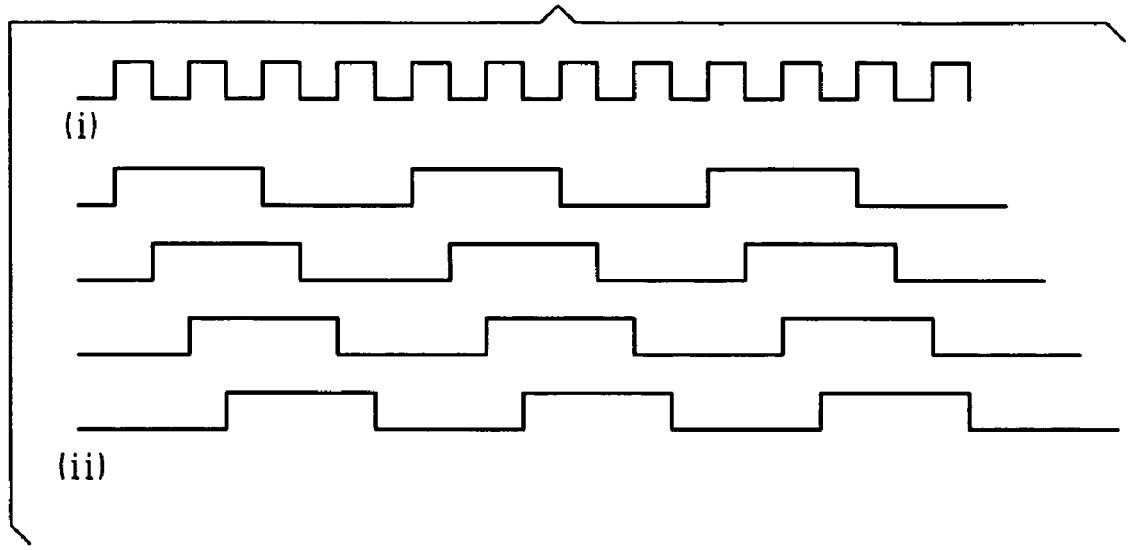
FIG. 5B illustrates examples of multiple recovered sampling clock signals of the embodiment depicted in FIG. 5A relative to the full rate recovered sampling clock.

The present invention utilizes a parallel sampled multi stage decimated digital loop filter for clock and data recovery function. FIG. 5A is a high level block diagram of one embodiment of this invention. As depicted, multiple sampling clocks 510 are used in conjunction with multiple data detectors 108 to obtain multiple samples of the analog signal 106. These outputs of the data detectors represent recovered/retimed data that is then supplied to multiple phase detectors 202. The present invention permits these multiple sampling clocks to be at a lower rate than the full data rate. FIG. 5B illustrates (i) a full data rate recovered sampling clock relative to various examples of (ii) four lower rate (each at $\frac{1}{4}^{th}$ of the full data rate) recovered sampling clocks.

As depicted in FIG. 5A the outputs of the multiple phase detectors 202 are combined by means of a first stage decimation filter, DF1 402. This filter can be of any length or form (e.g. Finite Impulse Response/Infinite Impulse Response (FIR/IIR)) as is practicable. At 404 the first stage decimation filter 402 output is downsampled by a factor of D1. In the depicted embodiment, 4 parallel sampled data/phase detectors 202 are followed by a two stage decimation filter 402 and 502. The second stage decimation filter 502 is denoted as DF2 and the second stage downsampling factor is denoted as D2. Alternative embodiments of the invention may employ any number of decimation stages.

The output of the final stage decimation and downsampling (502 and 504, respectively) is processed by the loop filter 506. The loop filter operates at 1/Dth of the full data rate where D is the aggregate decimation factor. In this example the aggregate decimation factor is D=D1×D2. The phase selection circuitry likewise operates at only 1/Dth the full data rate. In additional embodiment of the invention, discussed below, the decimation process may be performed incommensurately.

The multi stage decimation process of the present invention will limit the rate at which the PSC 304 is updated. In additional embodiments of the invention a non-linear clipping mechanism is employed in the loop filter which limits the maximum phase change at the output of the loop filter 506 and hence the analog phase selection circuitry, PSC 304. This allows for a simplified design of the PSC without significantly compromising performance. In further embodiments of the invention, one or more non-linearities may be employed in the loop filter 506 to achieve various performance vs. area/power tradeoffs.

Figure 6:
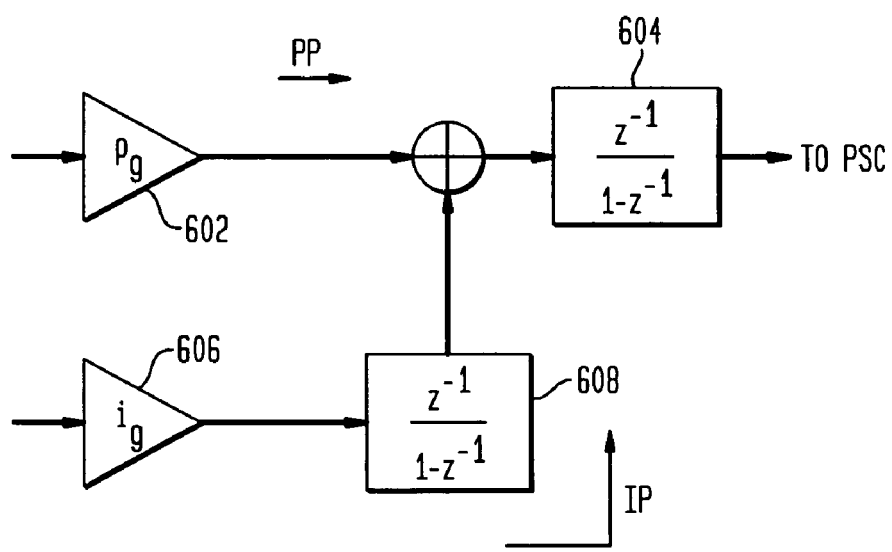
FIG. 6 is a Z domain representation of a second order loop filter consisting of two sub-filters.

FIG. 6 illustrates a well-known, second order, digital loop filter which in one embodiment of the invention is used as digital loop filter 506. As illustrated the second order filter consists of two sub-filters. The building blocks of the sub-filters are integrator blocks which in the Z domain have transfer functions:

$$\frac{z^{-1}}{1-z^{-1}}$$

There is a "proportional" path sub-filter PP through which the phase detector output is processed. In this example the phase detector output is gained by gain $p_g$ at 602 (if the gain is a power of 2, it would correspond to a left shift of bits), and finally passed through the integrator transfer function 604. Also illustrated is an "integral" path sub-filter IP through which the phase detector output is gained by a gain $i_g$ (if the gain is a power of 2, it would correspond with a left shift of bits) at 606 and finally passed through two successive integrator stages 608 and 604. Since the proportional PP and integral paths IP share the final integrator 604, their intermediate outputs can be summed before processing by the final integrator 604 whose output is then supplied to the PSC.

Figure 7:
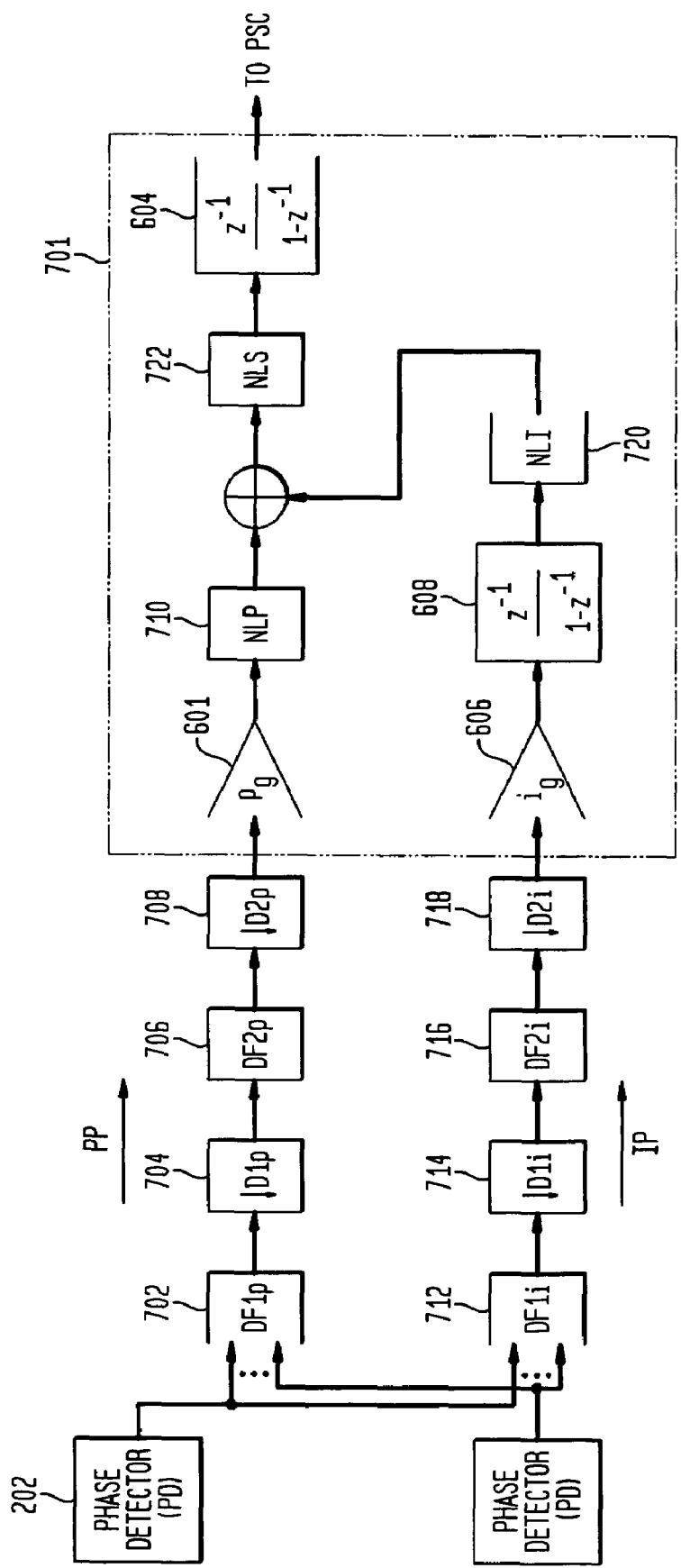
FIG. 7 is a Z domain representation of an embodiment of the invention having a second order loop filter consisting of two sub-filters.

FIG. 7 illustrates an embodiment of the invention which employs various non-linearities in a parallel sampled, multi stage, decimated second order digital loop filter. As illustrated, a second order loop filter 701 has been incorporated into this architecture. Similar to the embodiment of the invention depicted in FIG. 5A, there are again two decimation stages. However, these two stages are present for both the proportional PP and integral IP paths. The proportional path PP decimation filters are DF1p (702) and DF2p (706). The proportional path decimation factors are D1p (704) and D2p (708) for a total decimation factor of Dp=D1p×D2p. The integral path IP decimation filters are DF1i (712) and DF2i (716). The integral path IP decimation factors are D1i (714) and D2i (718) for a total decimation factor of Di=D1i×D2i. For each path, the outputs of the multiple phase detectors 202 are processed with the first stage decimation filter (702 and 712) and then fed to the second stage filter (706 and 716, respectively). Although the proportional PP and integral IP paths are depicted as having independently chosen decimation filters and decimation factors, the invention is not so limited as all or a portion of the decimation filtering and downsampling factors could be common to the two paths.

In the embodiment of the invention depicted in FIG. 7, non-linearities are introduced at several locations: in the proportional PP path (NLP) 710, in the integral path (NLI) 720, and in the sum path (NLS) 722. Examples of such non-linearities are:

A sgn function where the output of the non-linearity consists of taking the sign of the input. This results in further area/power savings as the arithmetic width of the internal signals is reduced.

A clipping function whereby the maximum range of the non-linear block output is limited to a range smaller than normally possible. The use of this type of function in the NLS block provides a significant implementation advantage: it limits the maximum magnitude of the phase change generated by the loop filter and hence the PSC. Although the decimation process itself limits the maximum rate at which the PSC sampling phases can change to 1/Dth the full data rate, this additional non-linearity also limits the magnitude of the phase change.

In further embodiments of the invention not necessarily all three, but rather any combination of these non-linearities (NLP, NLI, NLS) may be employed by the invention.

Further embodiments of the invention employ incommensurate decimation. The filtering efficacy of the decimation filter is determined by its length. The filtering length required in turn depends on the downsampling factor. That is, typically a larger downsampling factor requires a longer length decimation filter. In the special case of popular "sinc" decimation, the filter length is typically chosen to be the same as the downsampling factor. To save area and power, one would want to use a common decimation filter for both sub-filters. This would typically imply that the downsampling factors in the two sub-filters might need to be the same as they are processed by a common decimation filter. In this embodiment of the invention a common decimation filter could be used for one or more of the sub-filters even while the downsampling factors are different for the two sub-filters. As used herein, this feature is called incommensurate decimation because:

1. The downsampling factors in the sub-filters need not be the same; and,
2. The length of the decimation filter in each of the subfilters may not necessarily be the same.
3. In the case of sinc decimation the length of the decimation filters may be chosen to be smaller than the downsampling factor.

Figure 8:
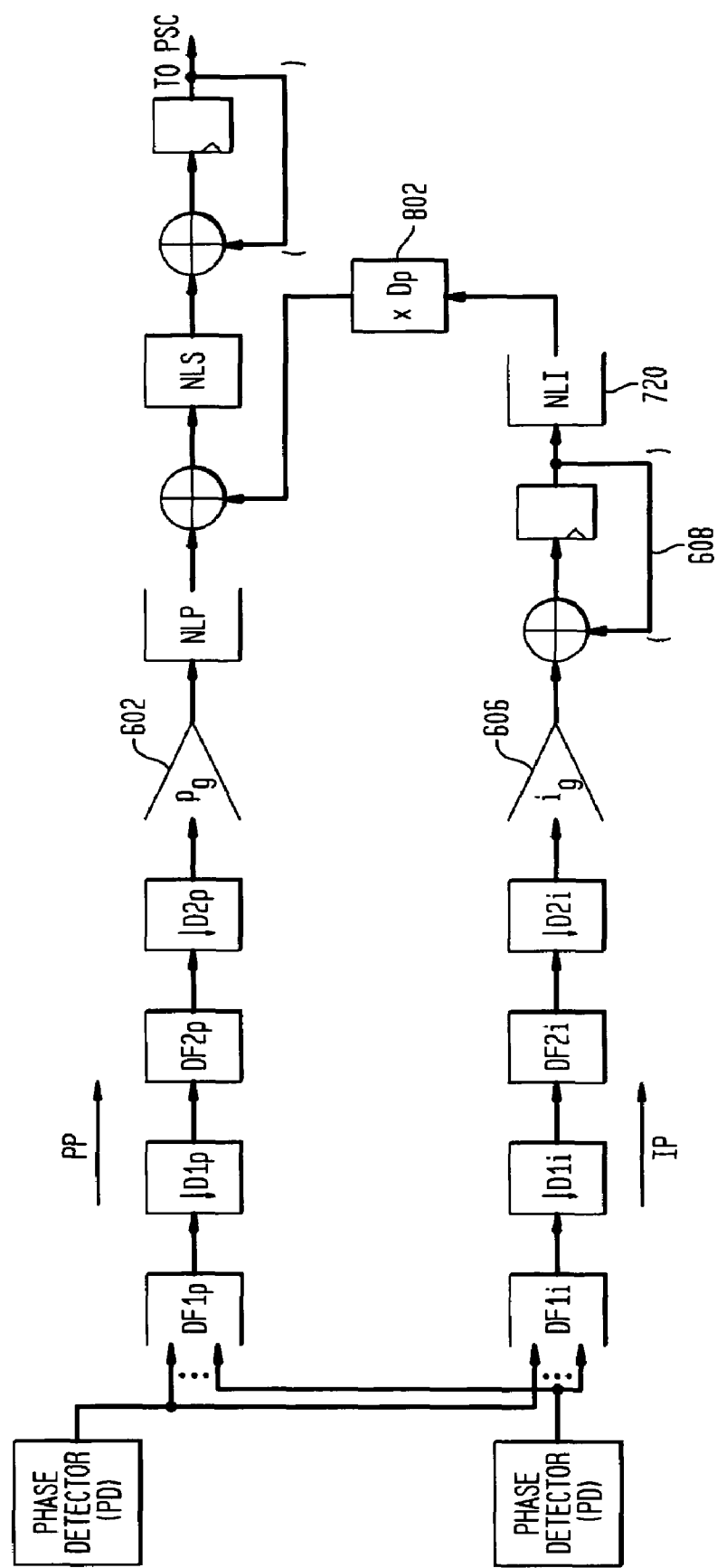
FIG. 8 is a block diagram of an embodiment of the invention having a second order loop filter consisting of two sub-filters.

It should be noted that one or more sub-filters may employ an extra gain for proper operation. This is shown in the embodiment of the invention depicted in FIG. 8 where the integral IP path sub-filter has a gain factor of Dp 802 (which can be trivially implemented as a shift of data bits when Dp is a power of 2).

Figure 9:
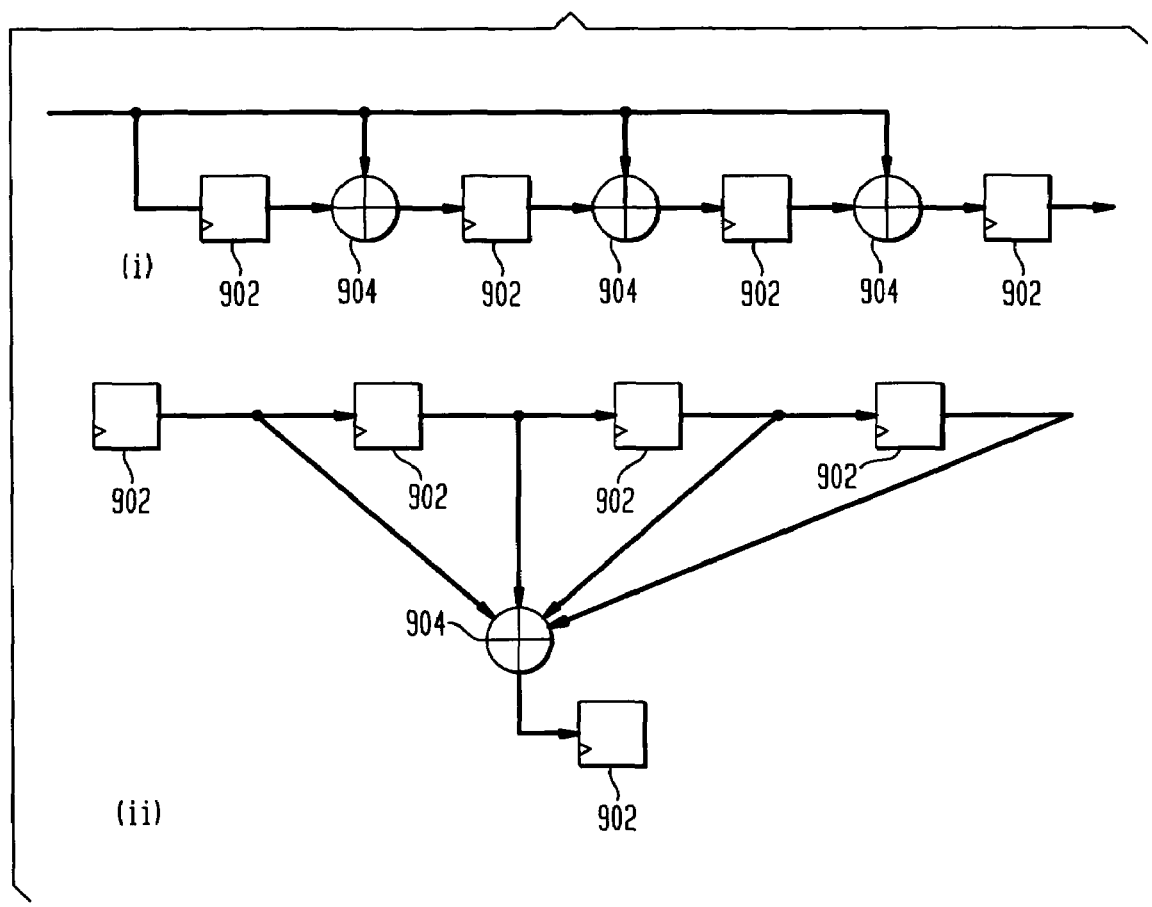
FIG. 9 depicts exemplary length 4, simple decimation filters.
Figure 10:
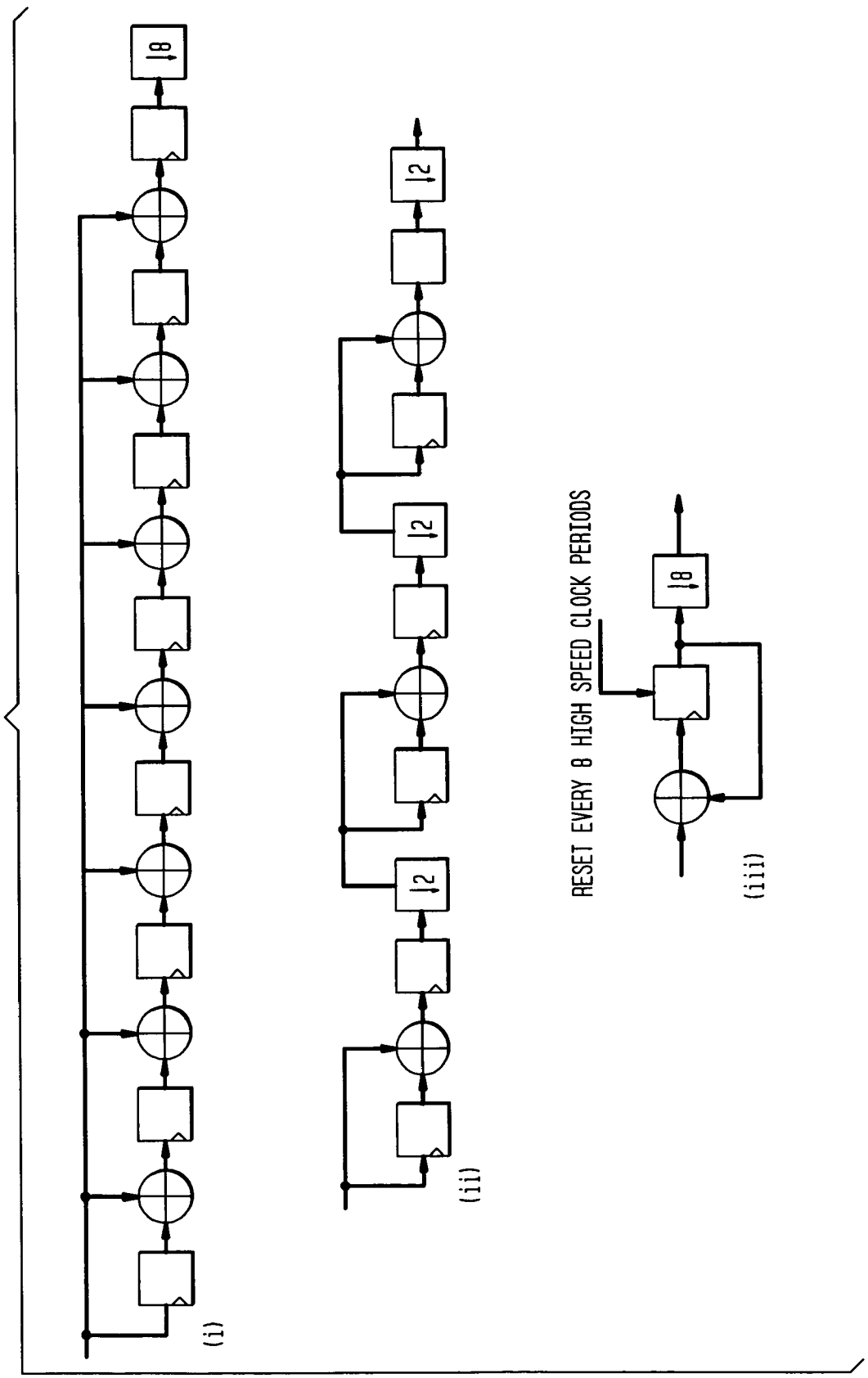
FIG. 10 depicts exemplary length 8 decimation filters in combination with downsampling by a factor of 8.

Various alternative decimation filter structures useable with the present invention will now be briefly discussed. A block diagram of a simple sinc decimation filter of length 4 is shown by itself in FIG. 9, implemented in (i) transposed form (ii) direct form and wherein, items labeled 902 and 904 are delay elements and adders, respectively. The combination of the decimation filter and the downsampling operation could be implemented in various different ways as is known in the art. For example, for a length 8 decimation filter followed by a downsampling factor of 8, three possible implementations are shown in FIG. 10. Any one of these (or other) methods of implementing a decimation filter followed by downsampling could be incorporated into the various embodiments of the invention, to include those depicted in FIGS. 5A, 7, and 8. As is well-known in the art, non-unity coefficients could be employed in the filter branches of FIGS. 9 and 10 to yield a more general filter.

An additional feature of the embodiment of the invention depicted in FIG. 5A is that due to the use of parallel sampling, the parallel phase detector samples are naturally delayed with respect to one another. Therefore, the first stage decimation filter actually would not require any delay elements but only the filter weighting and combining (addition) elements to implement the first stage of decimation filtering.

ADDITIONAL EMBODIMENTS OF THE INVENTION

The above described embodiments of the invention are meant to illustrate the invention. The invention is not necessarily limited to the specific features described above. In particular, further embodiments of the invention include the following features:

Use of a different number of parallel clocks and resulting data/phase detectors. That is, the use of 4 is only an example, as 2, 3, or any integer number can be employed.

Use of more or less than 2 sub-filters considered in the examples above for the second order digital CDR loop filter.

Not performing any decimation filtering and downsampling in one or more of the sub-filters.

Each sub-filter could consist of other basic building blocks other than an integrator which has the transfer function $$\frac{z^{-1}}{1-z^{-1}}.$$

For example a sub-filter could contain a transfer function of a differentiator such as $1-cz^{-1}$ or the integrator transfer function could be modified to be such as $$\frac{z^{-1}}{1-cz^{-1}}.$$

Instead of being fixed, the gains $p_g$ and $i_g$ can be time varying during operation based on some pre-determined gain change schedule. The CDR loop can achieve more optimal performance with the time varying gains. The gains $p_g$ and $i_g$ need not be a power of 2.

The combination of decimation filter and downsampling operation can be implemented in a variety of ways:

Decimation filters other than sinc filters can be used.

Any integer downsampling factor can be used for any of the downsampling factors in any of the multi stage decimators.

The decimated digital loop filter CDR architecture could be used in conjunction with any of many different types of data detectors (e.g. slicer, sequence detector, digital feedback equalizer) or phase detectors (e.g. bang-bang phase detector, linear phase detector, slope table based phase detector, Hogge phase detector). In some cases the choice of phase detectors will require more clock signals to be generated by the PSC (and possible, additional corresponding data detectors) but this will not affect the basic nature of the present architecture.

While the invention has been described with reference to various embodiments thereof, it will be appreciated by those of ordinary skill in the art that modifications can be made to the structure and elements of the invention without departing from the spirit and scope of the invention as a whole.

What is claimed is:

1. A clock and data recovery circuit for recovery of an inputted analog signal, said circuit comprising:

at least two data detectors to receive in parallel said inputted analog signal, each of said detectors to detect samples of the analog signal and to produce a data detector output;

a phase detector for each of said data detectors, said phase detector to receive as input the data detector output and to produce a phase detector output;

a first stage decimation filter for combining said phase detector outputs;

a first stage downsampling circuit to downsample the output of the first stage decimation filter;

a series of at least one additional stage decimation filter in combination with an additional downsampling circuit to further downsample the output of the first stage downsampling circuit;

a digital loop filter to filter the output of said series to produce a filtered signal;

a phase selection circuit to use the filtered signal to produce at least two recovered sampling clock signals where each said recovered sampling clock signal is inputted to only one data detector.

2. The clock and data recovery circuit of claim 1 wherein said inputted analog signal occurs at a full data rate and wherein said recovered sampling clock signals each occur at a lower rate.

3. The clock and data recovery circuit of claim 2 wherein said recovered sampling clock signals have sampling clock phases separated in time.

4. The clock and data recovery circuit of claim 3 wherein D is defined as the aggregate decimation factor attained by the combination of first stage and said series of decimation and downsampling stages and wherein said digital loop filter operates at $1/D^{th}$ of the full data rate.

5. The clock and data recovery circuit of claim 3 wherein said digital loop filter further comprises a non-linear clipping mechanism to limit the filtered signal produced by the digital loop filter.

6. The clock and data recovery circuit of claim 2 wherein said digital loop filter further comprises:
a proportional path sub-filter;
a integral path sub-filter; and,
an integrator for processing the combined outputs of the proportional path sub-filter and the integral path sub-filter to produce said filtered signal.

7. The clock and data recovery circuit of claim 6 wherein decimation filters and downsampling circuits process independently signals supplied to the proportional path sub-filter and signals supplied to the integral path sub-filter.

8. The clock and data recovery circuit of claim 7 wherein non-linear circuits occur in at least one of the following locations:
at the output of the proportional path sub-filter;
at the output of the integral path sub-filter; and,
at the input of the integrator.

9. The clock and data recovery circuit of claim 8 wherein said non-linear circuits are selected from the group consisting of a sgn function, a clipping function, and combinations thereof.

10. The clock and data recovery circuit of claim 6 wherein a common decimation filter is used for signals supplied to both sub-filters and wherein different downsampling factors are used for signals supplied to the sub-filters.

11. A method of performing recovery of an inputted analog signal, said method comprising:
providing at least two data detectors to receive in parallel said inputted analog signal, each of said detectors to detect samples of the analog signal and to produce a data detector output;
providing a phase detector for each of said data detectors, said phase detector to receive as input the data detector output and to produce a phase detector output;
providing a decimation filter to obtain a combination of said phase detector outputs;
downsampling said combination to yield a first stage result;
performing a series of at least one additional stage decimation in combination with an additional downsampling to obtain a final decimated signal;
filtering said final decimated signal to produce a filtered signal;
utilizing the filtered signal to produce at least two recovered sampling clock signals where each said recovered sampling clock signal is inputted to only one of said data detectors.

12. The method of claim 11 wherein said inputted analog signal occurs at a full data rate and wherein said recovered sampling clock signals each occur at a lower rate.

13. The method of claim 12 wherein said recovered sampling clock signals have sampling clock phases separated in time.

14. The method of claim 13 wherein D is defined as the aggregate decimation factor employed to yield the final decimated signal and wherein said digital loop filter operates at $1/D^{th}$ of the full data rate.

15. The method of claim 13 wherein said filtering step further comprises a non-linear clipping function.

16. The method of claim 12 wherein said filtering step further comprises:
processing said final decimated signal utilizing a proportional path sub-filter;
processing said final decimated signal utilizing a integral path sub-filter; and,
processing the combined outputs of the proportional path sub-filter and the integral path sub-filter to produce said filtered signal.

17. The method of claim 16 wherein decimation filters and downsampling circuits process independently signals supplied to the proportional path sub-filter and signals supplied to the integral path sub-filter.

18. The method of claim 17 further comprising utilizing non-linear circuits in at least one of the following locations:
at the output of the proportional path sub-filter;
at the output of the integral path sub-filter; and,
at the input of the integrator.

19. The method of claim 18 wherein said non-linear circuits are selected from the group consisting of a sgn function, a clipping function, and combinations thereof.

20. The method of claim 16 wherein the final decimated signal is obtained using a common decimation filter for signals supplied to both sub-filters and using different downsampling factors for signals supplied to the sub-filters.

21. An integrated circuit comprising a clock and data recovery circuit for recovery of an inputted analog signal, said clock and data recovery circuit comprising:
at least two data detectors to receive in parallel said inputted analog signal, each of said detectors to detect samples of the analog signal and to produce a data detector output;
a phase detector for each of said data detectors, said phase detector to receive as input the data detector output and to produce a phase detector output;
a first stage decimation filter for combining said phase detector outputs;
a first stage downsampling circuit to downsample the output of the first stage decimation filter;
a series of at least one additional stage decimation filter in combination with an additional downsampling circuit to further downsample the output of the first stage downsampling circuit;
a digital loop filter to filter the output of said series to produce a filtered signal;
a phase selection circuit to use the filtered signal to produce at least two recovered sampling clock signals where each said recovered sampling clock signal is inputted to only one data detector.

22. The clock and data recovery circuit of claim 21 wherein said inputted analog signal occurs at a full data rate and wherein said recovered sampling clock signals each occur at a lower rate.

23. The clock and data recovery circuit of claim 22 wherein said recovered sampling clock signals have sampling clock phases separated in time.

24. The clock and data recovery circuit of claim 23 wherein D is defined as the aggregate decimation factor attained by the combination of first stage and said series of decimation and downsampling stages and wherein said digital loop filter operates at $1/D^{th}$ of the full data rate.

25. The clock and data recovery circuit of claim 23 wherein said digital loop filter further comprises a non-linear clipping mechanism to limit the filtered signal produced by the digital loop filter.

26. The clock and data recovery circuit of claim 22 wherein said digital loop filter further comprises:
   a proportional path sub-filter;
   a integral path sub-filter; and,
   an integrator for processing the combined outputs of the proportional path sub-filter and the integral path sub-filter to produce said filtered signal.

27. The clock and data recovery circuit of claim 26 wherein decimation filters and downsampling circuits process independently signals supplied to the proportional path sub-filter and signals supplied to the integral path sub-filter.

28. The clock and data recovery circuit of claim 27 wherein non-linear circuits occur in at least one of the following locations:
   at the output of the proportional path sub-filter;
   at the output of the integral path sub-filter; and,
   at the input of the integrator.

29. The clock and data recovery circuit of claim 28 wherein said non-linear circuits are selected from the group consisting of a sgn function, a clipping function, and combinations thereof.

30. The clock and data recovery circuit of claim 26 wherein a common decimation filter is used for signals supplied to both sub-filters and wherein different downsampling factors are used for signals supplied to the sub-filters.

* * * * *